US009177757B2

(12) United States Patent
Ban et al.

(10) Patent No.: US 9,177,757 B2
(45) Date of Patent: Nov. 3, 2015

(54) CHARGED PARTICLE BEAM APPARATUS (71) Applicant: HITACHI HIGH-TECHNOLOGIES CORPORATION, Tokyo (JP)

(72) Inventors: Naoma Ban, Tokyo (JP); Kenji Obara, Tokyo (JP); Takehiro Hirai, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 14/417,647

(22) PCT Filed: Jun. 21, 2013

(86) PCT No.: PCT/JP2013/067022
§ 371 (c)(1),
(2) Date: Jan. 27, 2015

(87) PCT Pub. No.: WO2014/021019
PCT Pub. Date: Feb. 6, 2014

(65) Prior Publication Data
US 2015/0170875 A1    Jun. 18, 2015

(30) Foreign Application Priority Data
Aug. 3, 2012    (JP) .................................. 2012-172473

(51) Int. Cl.
H01J 37/26    (2006.01)
H01J 37/22    (2006.01)
H01J 37/04    (2006.01)

(52) U.S. Cl.
CPC ............... *H01J 37/222* (2013.01); *H01J 37/04* (2013.01); *H01J 37/261* (2013.01); *H01J 2237/049* (2013.01); *H01J 2237/063* (2013.01); *H01J 2237/2448* (2013.01); *H01J 2237/24592* (2013.01); *H01J 2237/2602* (2013.01)

(58) Field of Classification Search
USPC ................. 250/305, 306, 307, 309, 310, 311, 250/492.1, 492.2, 492.3
See application file for complete search history.

(56) References Cited

U.S. PATENT DOCUMENTS 6,548,811 B1    4/2003    Nakamura et al.
6,875,984 B2 *  4/2005    Kakibayashi et al. ........ 250/311
(Continued)

FOREIGN PATENT DOCUMENTS

JP    2000-243338 A    9/2000
JP    2002-313862 A    10/2002
(Continued)

OTHER PUBLICATIONS

English translation International Search Report PCT/JP2013/067022 dated Aug. 13, 2013.
(Continued)

*Primary Examiner* — Nicole Ippolito
(74) *Attorney, Agent, or Firm* — McDermott Will & Emery LLP (57) ABSTRACT

The present invention relates to a defect inspection apparatus based on the fact that contrasts of a grain and a void of a semiconductor copper interconnect in a scanning electron microscope are changed depending on electron beam irradiation accelerating voltages. A charged particle beam apparatus of the present invention irradiates the same portion of a specimen with electron beams at a plurality of accelerating voltages, and differentiates a grain (65, 66) from a void (67) on the basis of a contrast change amount of the same portion in a plurality of images (61, 62) acquired so as to respectively correspond to the plurality of accelerating voltages. Consequently, it is possible to automatically detect a grain and a void in a differentiation manner at a high speed without destructing a specimen.

6 Claims, 6 Drawing Sheets

(56) References Cited

U.S. PATENT DOCUMENTS

| | | | |
|---|---|---|---|
| 8,518,536 B2 | 8/2013 | Ishibashi et al. | |
| 2003/0136907 A1* | 7/2003 | Takane et al. | 250/310 |
| 2003/0193025 A1* | 10/2003 | Takagi | 250/310 |
| 2009/0090863 A1 | 4/2009 | Watanabe et al. | |
| 2011/0204228 A1 | 8/2011 | Tsuno et al. | |

FOREIGN PATENT DOCUMENTS

| | | |
|---|---|---|
| JP | 2004-239877 A | 8/2004 |
| JP | 2009-87893 A | 4/2009 |
| TW | 2009-04756 A | 2/2009 |
| TW | 2009-35537 A | 8/2009 |
| WO | 2010052854 A1 | 5/2010 |

OTHER PUBLICATIONS

English translation Summary of Written Opinion of International Searching Authority PCT/JP2013/067022 dated Aug. 13, 2013.
International Preliminary Examination Report PCT/JP2013/067022 dated Nov. 14, 2014.
English Translation Office Action Taiwan Patent Application No. 102122951 dated Oct. 2, 2014.

* cited by examiner

CHARGED PARTICLE BEAM APPARATUS

CROSS-REFERENCE TO RELATED APPLICATIONS

This Application is the U.S. National Phase of PCT/JP2013/067022 filed Jun. 21, 2013, which claims priority from Japanese Patent Application No. JP 2012-172473 filed Aug. 3, 2012. The subject matter of each is incorporated herein by reference in entirety.

TECHNICAL FIELD

The present invention relates to a charged particle beam apparatus for inspecting defects which are generated during manufacturing of a semiconductor device.

BACKGROUND ART

In recent years, as an interconnect material of a semiconductor device, copper (Cu) with low resistivity has been used as one of means for reducing interconnect delay in order to increase an operation frequency of the device. In a Cu interconnect process, a diffusion prevention film (barrier metal) and an electroplated base conductive film (Cu seed) are sequentially formed in a trench (interconnect groove) which is provided in an insulating film, by using a sputtering method, and a Cu interconnect is metalized therein so as to be formed by using an electroplating method. Metallization characteristics of the Cu interconnect are defined depending on a coating shape of the seed layer, metallization performance of electrolytic plating, or the like, but there is a limitation in performance of metallization into a minute shape. Thus, a perfect metallization without defects is not easy in an ultra-narrow trench, and, as a result, void defects may be generated. Particularly, in a case where void defects are generated inside the interconnect, the defects cause disconnection, an increase in interconnect resistance, and a reduction in resistance to electro-migration. Therefore, poor metallization of the Cu interconnect is critically problematic in relation to interconnect reliability, and further semiconductor device performance, and thus there is a demand for a technique of detecting voids in the Cu interconnect in line. In addition, in order to detect voids caused by the process in line and to feedback a result thereof to a process condition, it is necessary to quickly detect the voids in a nondestructive manner.

Since voids are present inside an interconnect, the voids cannot be detected by an optical inspection apparatus of a dark field and bright field type used for typical semiconductor device inspection. Generally, a planarization step (CMP) is performed, and then voids are detected by using an SEM. In order to detect voids present inside an interconnect by using the SEM, electron beams with high energy can penetrate into a specimen, and thus it is necessary to irradiate the specimen with electron beams with a high accelerating voltage of 5 kV or higher. However, contrasts of crystal grains (grains) appear along with the voids under the high accelerating voltage, and thus there is a case where the grains and the voids are hardly differentiated from each other only on the basis of an SEM image. In order to detect the voids, an FIB+SEM/TEM method in which cross-section processing of an interconnect portion using a focused ion beam (FIB) apparatus is combined with void detection using a TEM or an SEM should be applied. In this FIB+SEM/TEM method, a cross-section of interconnect created with FIB is observed by using the SEM or TEM so that voids can be reliably specified, but the method has a problem in that a specimen is partially or completely destructed, and thus much time is required to prepare and observe the specimen. From the above facts, a void detection method is desirable which can be applied to an in-line inspection and allows voids to be easily detected at a high speed in a nondestructive manner.

As the related art for detecting voids, there is a CMP method in which wafer surface polishing using chemical-mechanical polishing (CMP) is combined with void detection using an optical type exterior inspection apparatus. In addition, there is a probe test method or the like in which electric resistance of an interconnect portion is measured, and Cu voids are detected on the basis of the fact that the electric resistance increases if voids are present.

PTL 1 discloses a technique in which the same portion is observed by variously changing electron beam incidence directions in a TEM so that crystal defects are observed, as a technique of detecting crystal defects corresponding to grains, or defects of a plug and a via interconnect by using the TEM.

CITATION LIST

Patent Literature

PTL 1: JP-A-2000-243338 (U.S. Pat. No. 6,548,811)

SUMMARY of INVENTION

Technical Problem

In the CMP method which is the related art for specifying grain defects, time is required to inspect the entire wafer, and complete destruction occurs. In addition, in the probe test method, the presence or absence of voids is merely estimated on the basis of a resistance value, and thus a location where avoid is generated in an interconnect or a size thereof cannot be understood. Further, in order to finally detect a minute void or a void inside an interconnect, the interconnect is required to be processed so that a cross-section thereof can be observed with an FIB, and then is observed by using an SEM or a TEM.

Solution to Problem

In order to solve the above-described problems, for example, configurations recited in the claims are employed.

The present application includes a plurality of means for solving the above-described problems, but, as an example, there is provided a charged particle beam apparatus including an electron optical system that focuses electron beams and irradiates a specimen with the electron beams; a detector that detects secondary electrons or reflected electrons generated from the specimen due to irradiation with the electron beams; and an image processing unit that compares a plurality of images with each other so as to detect a defect, in which the electron optical system irradiates the same portion of the specimen with the electron beams at a plurality of accelerating voltages, and in which the image processing unit differentiates a grain from a void on the basis of a contrast change amount of the same portion in a plurality of images which are acquired so as to respectively correspond to the plurality of accelerating voltages.

Advantageous Effects of Invention

According to the present invention, it is possible to specify a generation region of a minute void through nondestructive inspection.

Other problems, configurations, and effects will be apparent through description of the following embodiment.

DESCRIPTION OF EMBODIMENTS

First, problems to be solved by the present invention will be described more in detail.

The following description will be made of the reason why grains and voids of Cu cannot be differentiated from each other during observation in void detection using an SEM of the related art.

Visibility of a void in an SEM image depends on a contrast of the void. The void contrast is a contrast which is caused by a penetration depth of electron beams into a specimen being changed due to the presence or absence of a void, and, as a result, by an emission amount of reflected electrons at the void presence or absence portion being changed. In a portion where a void is present in the specimen, a penetration length increases, and thus a reflected electron emission amount decreases. On the other hand, in a portion where a void is absent, a penetration depth is small, an amount of the emitted BSE signal is larger than that in a peripheral portion where voids are not present, the contrast becomes lower than that of the peripheral portion in an SEM image, and thus the void can be observed as a black point with low brightness.

However, during metallization process of a Cu interconnect, sizes of grains are not uniformly formed due to variations in nonuniform flow of a Cu electroplating liquid or coating shapes, and thus grains having different crystal orientations are generated in the interconnect. An electron channeling phenomenon occurs in a grain having a specific orientation which is highly different from that of peripheral crystals, and brightness decreases in the same manner as in voids in an SEM image. In a case where a grain having a specific orientation and a void are present in the same observation region, the grain and the void cannot be clearly differentiated from each other.

This will be described more in detail. If the electron channeling phenomenon occurs, an amount of BSE emitted from a specimen changes. For example, when a Cu crystal orientation is nearly parallel to an electron beam incidence direction, incident electrons have a low probability of colliding with Cu atoms, and thus a penetration length of the incident electrons increases. As a result, an emission amount of electrons reflected from a specimen surface decreases, and a grain looks dark in an SEM image since a signal amount decreases and thus a brightness value is reduced. On the other hand, in a case where a crystal orientation is tilted with respect to an electron incidence direction, incident electrons have a high probability of colliding with Cu atoms, a penetration length of the incident electrons decreases, and, as a result, a reflected electron emission amount increases. A grain looks bright in an SEM image since a signal amount increases and thus a brightness value also increases. As mentioned above, the grain having a specific crystal orientation is observed in a low contrast in a BSE image in the same manner as a void, and hinders the void from being observed.

The CMP method of the related art is a method in which wafer polishing and exterior inspection are repeatedly performed, and voids can be detected by using an SEM or an optical inspection apparatus, but is a complete destructive inspection which requires time to inspect the entire wafer. In addition, in the probe test method, the presence or absence of voids is merely estimated on the basis of a resistance value, and thus a location where a void is generated in an interconnect or a size thereof cannot be identified. Further, in order to finally detect a minute void or a void inside an interconnect, partial or complete destructive inspection based on the FIB+SEM/TEM method is necessary.

As a technique of the related art in which voids and grains are differentiated from each other and are detected, for example, PTL 1 discloses a laser induction method in which Cu voids are detected by using the fact that changes in electrical resistance due to heat generation during irradiation with laser beams differ depending on failure locations.

In this method, an increase in electrical resistance caused by a temperature increase during irradiation with laser beams is grasped as a change in an observation current and is converted into brightness in synchronization with beam scanning, and thus a void generation location and a grain are identified in an image. However, in an inspection apparatus of an optical type such as a laser induction method, there is a limitation in a spatial resolution due to an induced laser wavelength, and thus it is hard to apply the apparatus to a minute interconnect (100 nm or less). Further, due to an increase in an interconnect resistance value resulting from micronization of an interconnect, it is hard to observe a feeble resistance value change caused by voids or grains.

As mentioned above, there is no void inspection method in which voids can be detected at a high speed, with high sensitivity, and in a nondestructive manner, and the entire wafer can be inspected. An object of the present invention is to provide an observation method in which grains and voids can be automatically differentiated from each other at a high speed and be detected without destructing a specimen on the basis of the fact that contrasts corresponding to brightness of the grains and the voids of a Cu interconnect in an SEM image are changed by an electron beam irradiation accelerating voltage.

Hereinafter, an embodiment of the present invention will be described with reference to the accompanying drawings. In addition, as an example of a charged particle beam apparatus, an example using a scanning electron microscope will be described, but this is only an example of the present invention, and the present invention is not limited to the embodiment described below. In the present invention, the charged particle beam apparatus is assumed to widely include a device which captures an image of a specimen by using charged particle beams. Examples of the charged particle beam apparatus may include an inspection apparatus, a review apparatus, and a pattern measurement apparatus using a scanning electron microscope.

Figure 1:
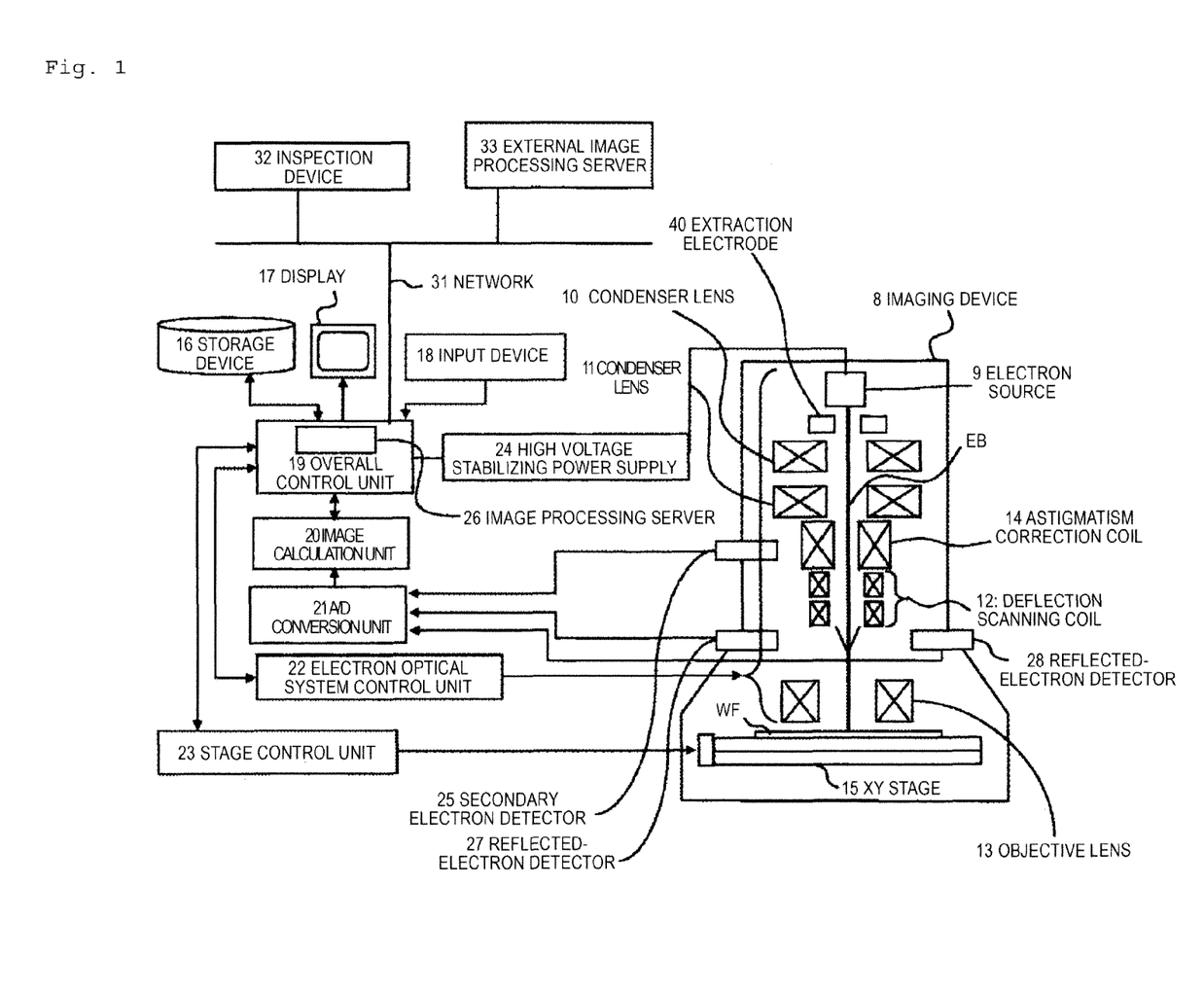
FIG. 1 is a schematic configuration diagram of the present embodiment.

FIG. 1 is a longitudinal cross-sectional view illustrating a schematic configuration of an electron microscope. An imaging device 8, which is an improvement of a scanning electron microscope (SEM), is used to review defects of a circuit pattern formed on a semiconductor wafer, to sequentially inspect defects in a portion which is designated in advance in a chip, or to inspect the circuit patterning quality, and is maintained to be vacuum from a generation portion of electron beams EB to a semiconductor wafer WF. The imaging device is provided with an electron source 9, condenser lenses 10 and 11, a deflection and scanning coil 12, an objective lens 13, an astigmatism correction coil 14, an XY stage 15, a secondary electron detector 25, and two reflected-electron detectors 27 and 28 having different operation angles. In addition, outside the vacuum device, there are provided a storage device 16 which stores various data items, a display 17 which displays an image or an inspection result, an input device 18 to which an operation instruction of a device is input, an image calculation unit 20 which generates or calculates an image of a specimen, an A/D conversion unit 21 which A/D converts a signal from the detector, an electron optical system control unit 22 which controls each component included in an electron optical system, a stage control unit 23 which controls the stage, and a high voltage stabilizing power supply 24 connected to the electron source 9. An overall control unit 19 is provided with an image processing server 26 which performs a defect detection process or patterning quality evaluation. Further, the overall control unit is connected to an external image processing server 33 via a network as necessary.

A configuration of the system is not limited thereto, and some or all devices constituting the system may be a common device. In addition, the charged particle beam apparatus may include a control unit which controls an operation of each unit, or an image generation unit which generates an image on the basis of a signal output from the detector (neither of which is illustrated). The control unit or the image processing unit may be constituted by hardware using a dedicated circuit board, and may be constituted by software executed by a computer connected to the charged particle beam apparatus. In a case where the control unit or the image processing unit is constituted by hardware, the unit may be implemented by integrating a plurality of calculators performing processes on an interconnect board, or in a semiconductor chip, or in a package. In a case where the control unit or the image processing unit is constituted by software, the unit may be implemented by mounting a high-speed general purpose CPU on a computer and by executing a program which performs a desired calculation process. An existing device can be upgraded by using a recording medium storing the program. Further, the device, the circuit, and the computer are connected to each other via a wired or wireless network, and data is transmitted and received therebetween as appropriate.

The semiconductor wafer WF to be inspected is placed on the XY stage 15. A control signal from the overall control unit 19 is sent to the stage control unit 23, and is then sent from the stage control unit 23 to the XY stage 15, so that the XY stage 15 is controlled so as to be moved in X and Y directions. The electron beams EB emitted from the electron source 9 are made to converge by the condenser lenses 10 and 11 and the objective lens 13, and are scanned on the semiconductor wafer WF by the deflection and scanning coil 12, so that the inspection target semiconductor wafer WF is irradiated. Secondary electrons obtained from the semiconductor wafer WF through the irradiation are detected by the secondary electron detector 25, and reflected electrons are detected by the reflected-electron detector 27 and the reflected-electron detector 28, and undergo a conversion process from an analog signal to a digital signal in the A/D conversion unit 21, so that digital image data (SEM image) of the semiconductor wafer WF is generated and is displayed on the display 17. Hereinafter, an SEM image generated by the secondary electron detector 25 is referred to as an SE image, and an SEM image generated by the reflected-electron detector 27 and the reflected-electron detector 28 is referred to as a BSE image.

An electron microscope which performs defect review or pattern inspection performs irregularity determination on the basis of shading information obtained from a reflected electron signal and thus includes at least one reflected-electron detector. The imaging device 8 used in the embodiment of the present invention includes the two reflected-electron detectors 27 and 28 having different reflected electron operating directions. An image process such as a defect detection process is performed by the image processing server 26. In the defect inspection, an operator inputs, via the input device 18, input items including optical conditions such as an accelerating voltage or a beam current, defect detection conditions such as sensitivity or a threshold value for detecting defects, and an inspection target chip of the semiconductor wafer WF and inspection coordinates in the chip. The input items are registered as a recipe and are stored in the storage device 16.

The overall control unit 19 sends a stage movement command to the stage control unit 23 so that an inspection position enters a field of view of the imaging device 8 on the basis of an inspection coordinate position registered in the recipe, then the XY stage 15 is moved, and an image is captured in a designated magnification setting. This image is referred to as an observation image. In addition, an image of the same portion of a chip adjacent to a chip in which an observation portion of the semiconductor wafer WF is present is captured in the designated magnification setting as necessary. This portion is a portion in which the same pattern as that of the observation portion is formed, and this image is referred to as a reference image. In a case of a cell in which an observation target pattern is repeatedly formed, a reference image may be generated from an observation image. In addition, in a fixed point inspection in which the same portions of chips are inspected in a plurality of chips, in order to increase inspection sensitivity or to reduce inspection time, a reference image is generated by combining a plurality of images acquired in the inspection. Further, as the reference image, not an actual SEM image but a reference image which is artificially created by using CAD data or the like may be used. A defect detection process through image comparison between the acquired observation image and reference image is performed by the image processing server 26. Still further, acquired image data is transmitted to the external image processing server 33 via the network as necessary, and the external image processing server 33 performs image evaluation for quantifying a defect detection process, semiconductor patterning quality, or the like.

An accelerating voltage of the electron beams EB emitted from the electron source 9 is controlled by an extracting voltage of extracting electrodes 40. In the present embodiment, control of an accelerating voltage will be described by exemplifying a method of controlling an extracting voltage of the extracting electrodes 40, but methods of controlling an accelerating voltage may employ various forms, and an accelerating voltage of electron beams applied to the semiconductor wafer WF may be finally controlled in the process of irradiation with the electron beams. For example, also by using a retarding method in which a negative voltage is applied to the semiconductor wafer WF, and the electron beams EB are decelerated right before being incident to the semiconductor wafer WF, it is possible to control an accelerating voltage of the electron beams applied to the semiconductor wafer WF. In addition, also by providing electrodes for accelerating and decelerating the electron beams on an electron beam irradiation path, it is possible to control an accelerating voltage.

Figure 2:
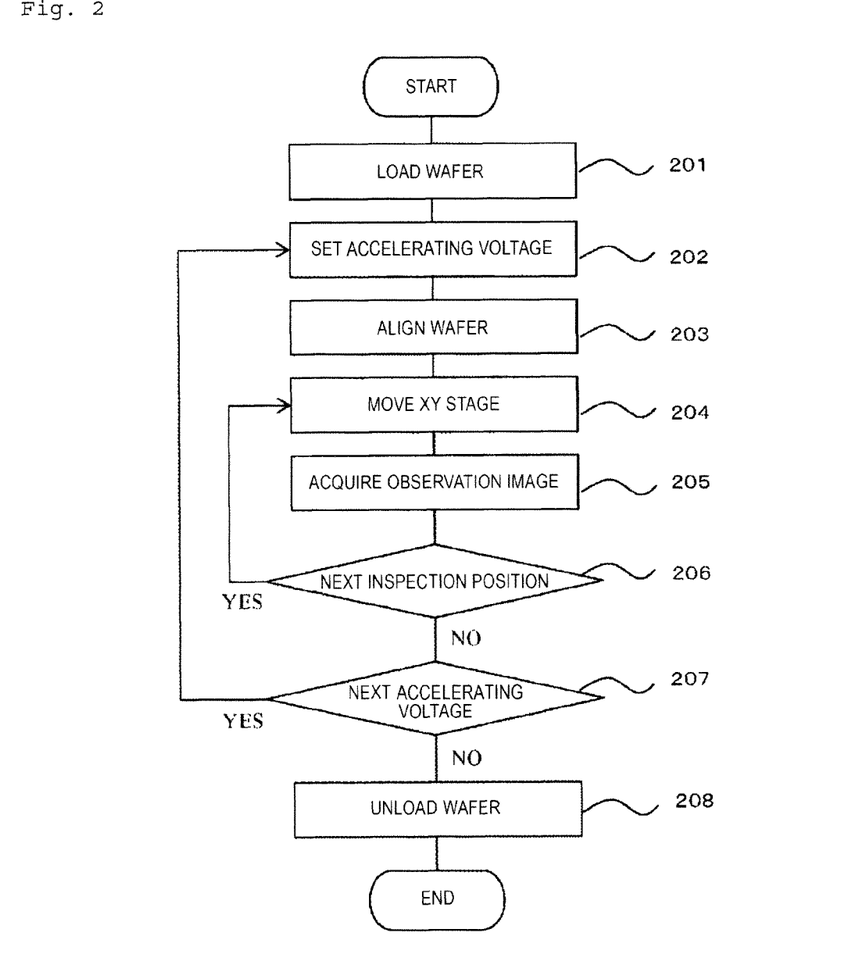
FIG. 2 is a diagram illustrating an imaging flow.

Next, a description will be made of an image acquisition flow during automatic defect observation in the present embodiment by exemplifying an operation of the above-described apparatus with reference to FIG. 2. A wafer is loaded (201), and then a first accelerating voltage is set (202). The wafer is aligned (203), then the XY stage is moved (204) on the basis of inspection position information which is registered in advance in the recipe as inspection conditions, and thus a field of view of the imaging device 8 is moved to an inspection position, thereby capturing an observation image (205).

Subsequently, if there is a next inspection position, the XY stage is sequentially moved to each inspection position so that observation images of all the inspection positions are acquired, and then the observation image acquisition flow at the first accelerating voltage is finished (206). Next, a second accelerating voltage is set, and, in the same manner as in the observation image acquisition flow at the first accelerating voltage, observation images are captured at all the inspection positions where the observation was performed at the first accelerating voltage, and an observation image acquisition flow at the second accelerating voltage is finished (207). Then, the wafer is unloaded (208). A plurality of accelerating voltages for sequential imaging can be set in the recipe as inspection information by a user. In a case where a third accelerating voltage, a fourth accelerating voltage, and a plurality of accelerating voltages are registered in the recipe as inspection conditions, the above-described flow is repeatedly performed at the third accelerating voltage, the fourth accelerating voltage, and the plurality of set accelerating voltages.

Figure 3:
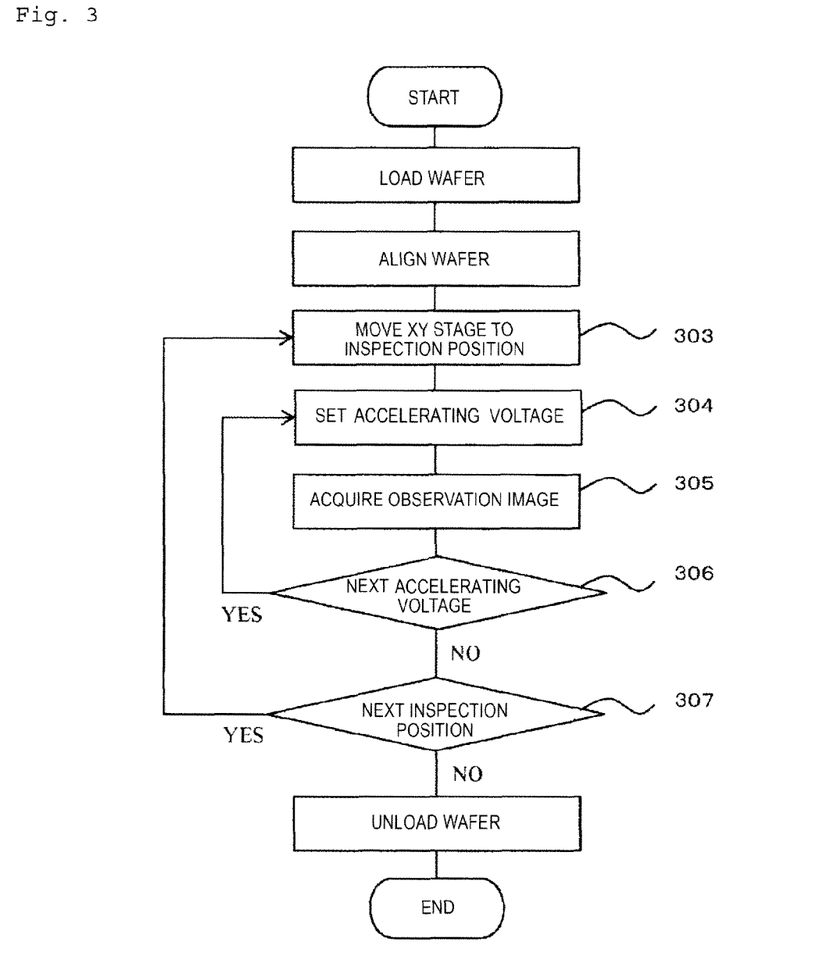
FIG. 3 is a diagram illustrating an imaging flow.

The above-described observation image acquisition flow is an example, and an order thereof does not matter as long as observation images can be acquired by capturing images of the same portion at a plurality of accelerating voltages. For example, as illustrated in FIG. 3, the following flow may be employed. The XY stage is moved to an inspection position (303); an accelerating voltage is set (304); an observation image is acquired (305); the next accelerating voltage is set (306); the same portion is repeatedly imaged at a plurality of accelerating voltages; and, if there is a next inspection position (307), the XY stage is moved (303) to the next inspection position. In addition, typically, since there is a case where, if an optical condition is changed, an optical axis is deviated, and thus an observation field of view of an SEM is moved, an image shift amount between existing accelerating voltages may be corrected in advance when an accelerating voltage is changed, and wafer alignment may be performed after an accelerating voltage is changed.

Here, a description will be made of a method of determining a plurality of accelerating voltages, which is a feature of the present invention, and the reason why the same portion is imaged at a plurality of accelerating voltages. As described above, an accelerating voltage influences contrasts of a void and a grain. The contrast of the void in an SEM image is a brightness difference caused by a difference between amounts of reflected electrons emitted from a portion where voids are present and a peripheral portion where voids are not present, and the contrast of the grain is a brightness value difference caused by differences between crystal orientations of respective portions.

The reason why the brightness difference occurs will be described in detail. Since there is no substance hindering penetration of electrons in a specimen at a portion where voids are present inside an interconnect, a penetration length of primary electrons increases, and thus electron beams penetrate more deeply than at a portion where voids are not present. Therefore, a signal amount of reflected electrons emitted from a specimen surface, that is, an interconnect surface decreases, and, as a result, brightness of a pixel in an SEM image is reduced, and thus the corresponding portion is displayed black. On the other hand, since an electron channeling phenomenon hardly occurs in a grain having a crystal orientation parallel to primary electron beams incident to a specimen, a penetration length increases, and thus an amount of reflected electrons emitted from a specimen surface is reduced. The grain having the above-described crystal orientation has low brightness in an SEM image, and thus the corresponding portion is displayed black. The reduction in brightness in a portion where a void or a grain is present indicates an increase in the contrast in an SEM image due to a brightness difference with a peripheral portion. From the above description, the contrast of the void depends on an accelerating voltage and a presence depth, and a level of the contrast of the grain depends on an accelerating voltage and a crystal orientation of the grain. Therefore, levels of contrasts of the void and the grain differ depending on sizes thereof, presence depths, and differences in crystal orientations, but fundamentally show different changes depending on accelerating voltages.

Figure 4:
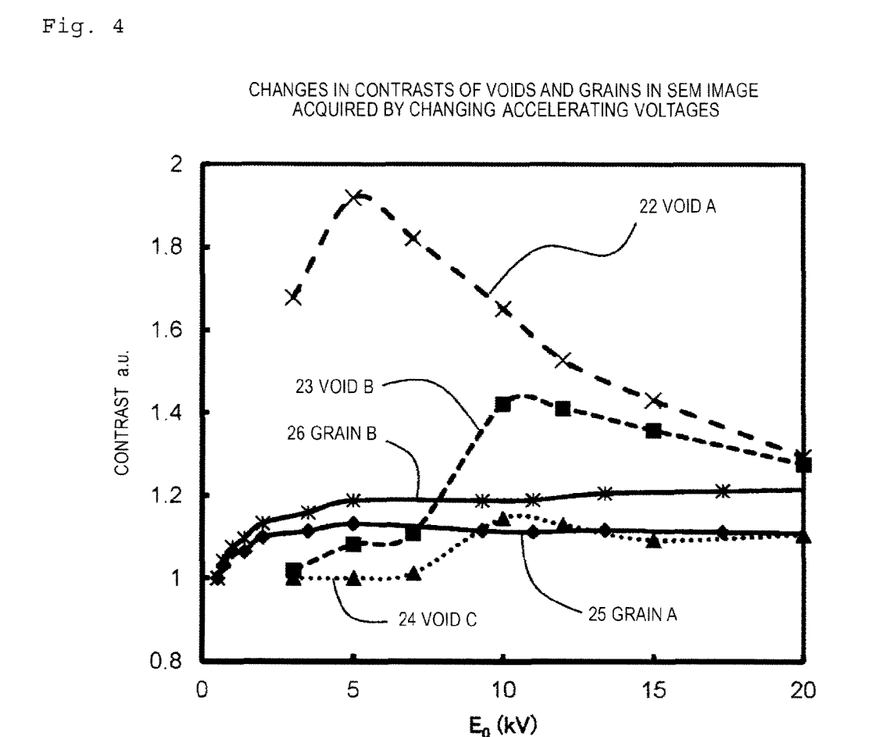
FIG. 4 is a diagram illustrating a relationship between contrasts of voids and grains and an accelerating voltage.

A relationship between contrasts of voids and grains and an accelerating voltage will be described in detail by exemplifying a minute Cu interconnect of which a line width is 30 nm and a depth is 60 nm, with reference to FIG. 4. FIG. 4 illustrates an example of changes in contrasts of a void A (22), a void B (23), and a void C (24) of which presence depths are different from each other, and a grain A (25) and a grain B (26) of which crystal orientations are different from each other, which are present in a Cu interconnect surrounded by an insulation film, when an accelerating voltage E0 is changed from 300 V to 20 kV. A transverse axis expresses an accelerating voltage, and a longitudinal axis expresses a contrast value. A greater contrast value indicates that a difference in a brightness value between a corresponding portion and a peripheral portion increases, and thus void observation or detection is easily performed. In addition, in a case where there is no void, a contrast value is 1 regardless of an accelerating voltage.

Figure 5:
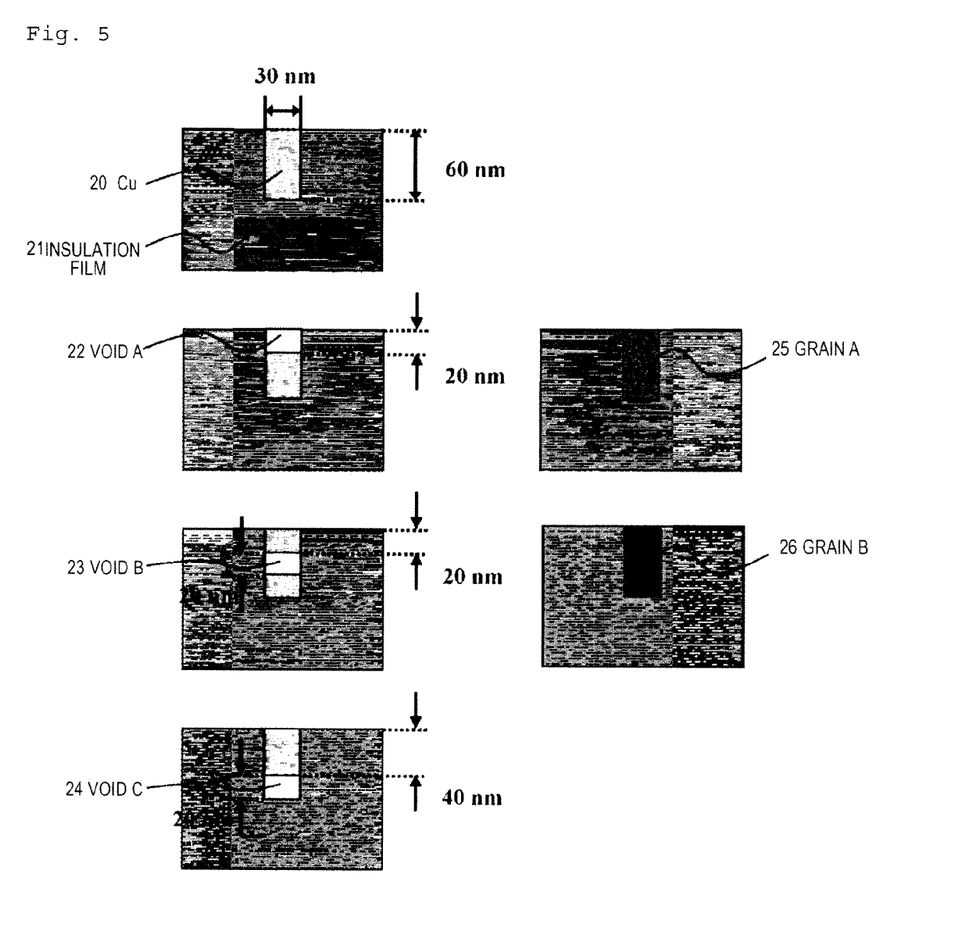
FIG. 5 is a longitudinal cross-sectional view of a Cu interconnect in which voids and grains are present.

FIG. 5 is a longitudinal cross-sectional view of a Cu interconnect in which the void A (22), the void B (23), the void C (24), the grain A (25), and the grain B (26) illustrated in FIG. 4 are present. The void A (22) is located at an upper part of the interconnect, the void B (23) is located at a middle part of the interconnect, and the void C (24) is located at a bottom part of the interconnect. The grain A (25) and the grain B (26) have different crystal orientations. It can be seen from FIG. 4 that contrasts of the void A (22), the void B (23), and the void C (24) increase as an accelerating voltage increases. Since the void A (22) is present closer to the interconnect surface than the void B (23), a penetration length of primary electrons is small, and a contrast thereof tends to increase in a range of 5 kV to 7 kV, and the maximum value can be obtained at 10 kV. On the other hand, since the void C (24) is present at the deep position of the bottom part of the interconnect, a penetration length of primary electrons is required to be large, and a contrast cannot be obtained in a range of 5 kV to 7 kV and increases from 7 kV, and the greatest contrast value can be obtained at 10 kV. At an accelerating voltage of 10 kV or higher, a penetration length of the primary electrons is larger than the depth of the Cu interconnect, and thus the contrasts of the voids A, B and C are reduced. Contrast values of the grain A (25) and the grain B (26) are different from each other due to a difference between crystal orientations, but both of the contrast values tend to be the maximum at a accelerating voltage of 5 kV, and a contrast change is smaller than that of the void at 5 kV or higher.

As described above, it can be seen that contrast values of a grain and a void greatly depend on an accelerating voltage, and respectively have distinctive tendencies. In addition, it can be seen that accelerating voltage dependency of a contrast value differs depending on a presence depth of a void.

For the Cu interconnect in which both the void C (24) and the grain A (25) illustrated in FIG. 4 are present in an imaging field of view, at accelerating voltages up to 5 kV, the grain A can be observed, but the void C (24) cannot be observed since a contrast thereof cannot be obtained. In addition, in a range of accelerating voltages of 10 kV to 20 kV, the void C (24) and the grain A (25) can be observed, but contrasts of the void C (24) and the grain A (25) are nearly equivalent to each other. In a defect detection process through comparison inspection using an observation image and a reference image captured at the same accelerating voltage in the related art, the void C (24) and the grain A (25) are detected as the same defect since the detection is performed by giving a threshold value to a change amount of contrasts of a differential image between the observation image and the reference image. For this reason, it can be seen that it is important to repeatedly capture images of the same portion at a plurality of accelerating voltages at which a contrast difference sufficient for detection can be obtained and to compare the images with each other.

Regarding accelerating voltages which are optimally selected as a plurality of accelerating voltages, an accelerating voltage for a grain causes a small contrast change amount, whereas an accelerating voltage for a void causes a large contrast change amount. In the example in which the voids and the grains illustrated in FIG. 4 are present, accelerating voltages are preferably selected from the ranges of 3 kV to 7 kV and 10 kV to 20 kV. For example, it can be easily estimated that a contrast with a small change amount observed at 5 kV and 10 kV is caused by a grain. On the contrary, if a contrast change amount is large, a void can be specified.

As a plurality of accelerating voltages, at least two accelerating voltages are necessary, but, in order to differentiate a void and a grain with high accuracy, the same portion is preferably imaged at three or more accelerating voltages. For example, by adding 20 kV at which a contrast of a void is reduced to 3 kV or 10 kV at which a void cannot be observed, it is possible to increase determination accuracy for differentiating a void with a grain. In addition, if images are captured at many accelerating voltages, a depth position can be specified on the basis of an accelerating voltage and characteristics of a contrast change.

As described above, it can be seen that, in order to differentiate a void from a grain, it is necessary to detect the void and the grain on the basis of a characteristic contrast change relative to an accelerating voltage.

Next, a description will be made of a process of detecting a void and a grain by using observation images captured at a plurality of accelerating voltages. A captured observation image is temporarily stored in the storage device 16, and is transmitted to the image processing server 26 so that a difference process is performed on observation images captured at different accelerating voltages. On the basis of a differential image obtained as a result of the difference process, a detection process of detecting a grain and a void in a differentiation manner is performed. The difference process and the detection process may be performed in real time along with capturing of an observation image, and an observation image may be transmitted to the external image processing server 33 after inspection and may then be processed offline. Needless to say, these processes may be performed in real time during execution of image capturing flow in the external image processing server 33.

Here, in the present embodiment, as an example of using captured images of the same portion at the first accelerating voltage 5 kV and the second accelerating voltage 10 kV, a detailed description will be made of a method of detecting a void by differentiating the void and a grain from each other with reference to FIG. 6. Extraction of a void region using an observation image 61 captured at the first accelerating voltage 5 kV and an observation image 62 captured at the second accelerating voltage 10 kV is performed through a difference process. It is assumed that a grain 65 is present in the observation image 61, and a grain 66 and a void 67 are present in the observation image 62. A difference process is performed on these images so as to generate an intermediate differential image 67. Then, a differential image 64 is generated by binarizing the intermediate differential image 63 with an appropriate threshold value, and a void region 69 is obtained. However, generally, in an SEM image, there is a case where contrasts sufficient to detect a void and a grain cannot be obtained depending on an observation optical condition, a surface structure, or quality of a material and the material.

When the intermediate differential image 63 is generated, various image processes are performed on the observation image and the observation image 62 before generating the intermediate differential image 63 as necessary, for the purpose of increasing detection sensitivity or accuracy. For example, in a case where a plurality of detectors are provided, a plurality of images formed by the plurality of detectors are combined with each other, but if brightnesses or contrasts of the observation image 61 and the observation image 62 are different from each other, adjustment of the contrast or brightness is performed on each image. Unevenness of a contrast and brightness of the entire SEM image, caused by charging of a specimen, is corrected as necessary. In a case where capturing positions of the observation image 61 and the observation image 62 are deviated relative to each other, an alignment process is performed when a differential image is created.

In addition, a void region 68 formed by the pixel units appears in the intermediate differential image 63 formed by a contrast value (brightness value) of a difference between the observation image 61 and the observation image 62. In the intermediate differential image 63 of the observation image 61 and the observation image 62, a portion of which a brightness value change amount is large can be detected as a void. A brightness value of the void region 68 in the intermediate differential image 63 is amplified on the basis of sensitivity setting registered in the recipe in advance. A size of the void region in the differential image 64 is defined depending on sensitivity and a threshold value parameter registered in the recipe in advance. Typically, a value which allows a detection target void to be detected is set. In addition, in order to improve inspection sensitivity, only a region which is desired to be detected in the observation image is set as a difference process target as necessary. For example, in the present embodiment, since only a void in the Cu interconnect is a detection target, the void can be effectively detected by limiting a detection target region only to a Cu interconnect 601.

Figure 6:
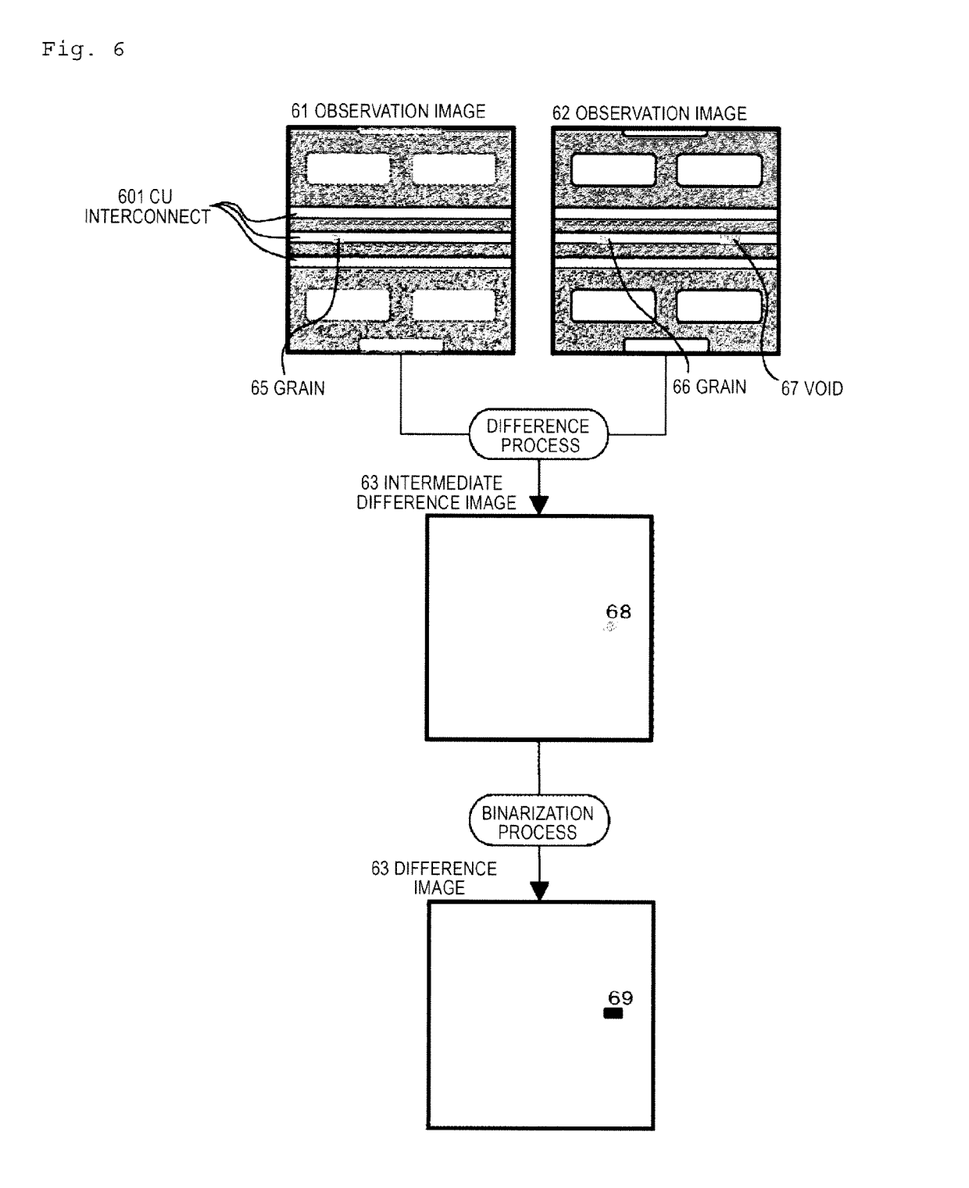
FIG. 6 is a diagram illustrating a method in which a void and a grain are differentiated from each other and the void is detected.

In FIG. 6, identification of a void and a grain has been described as a main specific example, but, in the same method, it is also possible to identify a void located at a depth which is desired to be a detection target and voids located at other depths. For example, it is possible to identify a depth of a void by comparing and referring to a contrast value of the void obtained from an intermediate differential image with a table in which a relationship between a depth and a contrast value of the void is preserved in advance.

According to the above-described method, since images of the same portion are captured at a plurality of accelerating voltages, and a difference process is performed on the plurality of captured images, a void present in a Cu interconnect can be detected so as to be differentiated from a grain. Consequently, a void generated in a metal interconnect step of a semiconductor device is inspected in line in a nondestructive manner, and the entire wafer is quickly inspected. Therefore, it is possible to reduce time required for optimization of a process condition of an interconnect step of a semiconductor device.

In addition, the present invention is not limited to the above-described embodiment, and includes various modification examples. For example, the embodiment has been described in detail for better understanding of the present invention, and all the above-described configurations are not necessarily required to be included.

In addition, the above-described respective configurations, functions, processing units, processing means, and the like may be realized by hardware, for example, by designing some or all of them with integrated circuits. Further, the above-described respective configurations, functions, and the like may be realized by software by a processor analyzing and executing a program which realizes each function. Information such as a program realizing each function, a table, and a file may be stored on a recording device such as a memory, a hard disk, or a solid state drive (SSD), or a recording medium such as an IC card, an SD card, or a DVD.

In addition, a control line or an information line which may be necessary for description is illustrated, and all control lines or information lines in a product are not illustrated. Actually, almost all of the configurations may be considered to be connected to each other.

REFERENCE SIGNS LIST

68 VOID REGION
69 VOID REGION

The invention claimed is:

1. A charged particle beam apparatus comprising:
    an electron optical system that focuses electron beams and irradiates a specimen with the electron beams;
    a detector that detects secondary electrons or reflected electrons generated from the specimen due to irradiation with the electron beams; and
    an image processing unit that compares a plurality of images with each other so as to detect a defect,
    wherein the electron optical system irradiates the same portion of the specimen with the electron beams at a plurality of accelerating voltages, and
    wherein the image processing unit differentiates a grain from a void on the basis of a contrast change amount of the same portion in a plurality of images which are acquired so as to respectively correspond to the plurality of accelerating voltages.

2. The charged particle beam apparatus according to claim 1,
    wherein the plurality of accelerating voltages are determined on the basis of a difference between contrast dependency of the grain on an accelerating voltage change of the electron beams and contrast dependency of the void on an accelerating voltage change of the electron beams.

3. The charged particle beam apparatus according to claim 1,
    wherein the plurality of images include at least a first image captured at a first accelerating voltage and a second image captured at a second accelerating voltage different from the first accelerating voltage,
    wherein a contrast difference between the void and the grain at the first accelerating voltage is larger than a contrast difference between the void and the grain at the second accelerating voltage, and
    wherein the image processing unit obtains a difference between the first image and the second image by comparing the first image with the second image, and determines that a region of the difference is the void.

4. A charged particle beam apparatus comprising:
    an electron optical system that focuses electron beams and irradiates a specimen with the electron beams;
    a detector that detects secondary electrons or reflected electrons generated from the specimen due to irradiation with the electron beams; and
    an image processing unit that compares a plurality of images with each other so as to detect a defect,
    wherein the electron optical system irradiates the same portion of the specimen with the electron beams at a plurality of accelerating voltages, and
    wherein the image processing unit identifies a void located at a depth designated in advance from a surface of the specimen on the basis of a contrast change amount of the same portion in a plurality of images which are acquired so as to respectively correspond to the plurality of accelerating voltages.

5. The charged particle beam apparatus according to claim 4,
    wherein the plurality of accelerating voltages are determined on the basis of a difference between contrast dependency of a void located at a first depth on an accelerating voltage change of the electron beams and contrast dependency of a void located at a second depth different from the first depth on an accelerating voltage change of the electron beams.

6. The charged particle beam apparatus according to claim 4,
    wherein the plurality of images include at least a first image captured at a first accelerating voltage and a second image captured at a second accelerating voltage different from the first accelerating voltage,
    wherein the first image and the second image include at least an image of a first void and an image of a second void located at a depth different from a depth of the first void,
    wherein a contrast difference between the first void and the second void at the first accelerating voltage is larger than a contrast difference between the first void and the second void at the second accelerating voltage, and
    wherein the image processing unit obtains a difference between the first image and the second image by comparing the first image with the second image, and determines that a region of the difference is the first void or the second void.

* * * * *